United States Patent [19]

Kurtz et al.

[11] Patent Number: 4,685,631
[45] Date of Patent: * Aug. 11, 1987

[54] APPARATUS FOR FEEDING BONDING WIRE

[75] Inventors: John A. Kurtz; Donald E. Cousens, both of Saco; Mark D. Dufour, Portland, all of Me.

[73] Assignee: Fairchild Semiconductor Corporation, Cupertino, Calif.

[*] Notice: The portion of the term of this patent subsequent to Feb. 12, 2002 has been disclaimed.

[21] Appl. No.: 697,833

[22] Filed: Feb. 4, 1985

Related U.S. Application Data

[62] Division of Ser. No. 507,340, Jun. 24, 1983, Pat. No. 4,498,638.

[51] Int. Cl.⁴ ............................................. B65H 49/34
[52] U.S. Cl. .................................... 242/47; 242/54 R; 242/158 R; 242/158.2
[58] Field of Search ................... 242/47, 54 R, 158 R, 242/158.2, 36, 39, 57; 254/331; 33/129, 132 R, 132 A, 133, 134

[56] References Cited

U.S. PATENT DOCUMENTS

| | | | |
|---|---|---|---|
| 1,221,975 | 4/1917 | Cuff | 242/158.2 |
| 1,781,134 | 11/1930 | Shoemaker | 242/158 R X |
| 1,962,670 | 6/1934 | Labora | 242/158.2 |
| 3,024,001 | 3/1962 | Worden et al. | 242/158.2 X |
| 3,456,899 | 7/1969 | Smith et al. | 242/158 R |
| 3,845,323 | 10/1974 | Bellasio | 242/57 X |
| 4,019,669 | 4/1977 | Tanimoto et al. | |
| 4,083,515 | 4/1978 | Dickerson | 242/158 R |
| 4,195,292 | 3/1980 | Puhich | |
| 4,286,487 | 9/1981 | Rubel | 242/57 X |
| 4,456,199 | 6/1984 | Seibert | 242/158 R |
| 4,498,638 | 2/1985 | Kurtz et al. | 242/45 |

FOREIGN PATENT DOCUMENTS 2130188 12/1972 Fed. Rep. of Germany.
893350 4/1962 United Kingdom.

Primary Examiner—Stanley N. Gilreath
Attorney, Agent, or Firm—Steven J. Phillips; David H. Carroll; Daniel H. Kane, Jr.

[57] ABSTRACT

An apparatus is described for maintaining and delivering a slack reserve length of lead wire between a spool or other source and the wire bonding tool of a lead wire bonding machine. A slack chamber or wind chamber comprised of a housing enclosure, an inlet guide on one side for guiding lead wire into the slack chamber from a spool, an outlet guide on the other side for guiding lead wire out of the slack chamber towards the wire bonding tool maintains the reserve length of lead wire in untangled condition. A source of pressurized dry air or other gas directs a gaseous flow into the slack chamber so that the lead wire is maintained suspended in the gaseous flow in an offset configuration. Wire sensors are operatively positioned in the slack chamber for sensing the offset of lead wire in the wind stream. The wire sensors are coupled to sensor and control logic for controlling the delivery and feeding of lead wire from a spool into the slack chamber. The wire sensors define inner and outer limits of offset thereby maintaining the reserve length within a desired range. Additional elements for back-up control of the lead wire and for handling the spool are described.

4 Claims, 11 Drawing Figures

APPARATUS FOR FEEDING BONDING WIRE

This is a division of application Ser. No. 507,340, filed June 24, 1983, now U.S. Pat. No. 4,498,638 issued Feb. 12, 1985.

TECHNICAL FIELD

This invention relates to new apparatus for maintaining and delivering a slack reserve of lead wire between a spool or other source and the wire bonding tool of a lead wire bonding machine. The invention has particular application for lead wire bonding machines used in bonding lead wires between a microcircuit chip and the lead frame on which the chip is mounted for coupling to external circuitry. The invention provides controlled maintenance of slack reserve capillary lead wire sufficient for automated and multiple bonding operations and for feeding and delivery of the slack reserve lead wire in untangled and slightly tensioned condition.

BACKGROUND ART

Integrated circuit or microcircuit chips are generally mounted on lead frames for coupling to external circuitry. Lead wires are bonded between die pads on the microcircuit chip and the lead frame fingers using manual or automatic ball bonding machines. The fine lead wire is generally stored on a stationary spool. The wire is drawn off the end of the spool and fed through a capillary wire holding tool or bonding tool which performs successive multiple bonding operations. Typically, one end of the lead wire is bonded to a die pad of the integrated circuit chip using ball bonding methods. The other end of the lead wire is bonded to a lead frame finger using a wedge bond or weld.

An example of a manual ball bonding machine is the Kulicke & Soffa Industries, Inc. (K&S), Model #478, which is actually a semi-automatic machine. The capillary wire holding or bonding tool is manually positioned by an operator viewing through a microscope objective. The bonding itself is then performed by an automatic operation of the ball bonding machine. However, manual positioning and monitoring slows down the lead wire bonding operation. A modification and further description of the manual or semi-automatic ball bonding machine is found in U.S. patent application, Ser. No. 294,411, filed Aug. 19, 1981 for LEAD FRAME WIRE BONDING BY PREHEATING, by the same assignee as the present application.

The fully automatic lead wire bonding machine greatly increases the speed of the lead wire bonding and chip packaging operation. An example of the automated ball bonding machine or robot is the Kulicke & Soffa Industries, Inc. (K&S), Model #1419, Hi Speed Ball Bonder. A modification of this ball bonding machine for fully automatic error correcting robot operation is described in U.S. patent application, Ser. No. 470,217, filed Feb. 28, 1983 for LEAD WIRE BOND ATTEMPT DETECTION, filed by the same inventive entity and assignee as the present application.

With the advent of high speed automatic ball bonding machines and robots a difficulty is encountered in feeding the fine capillary lead wire from the source such as a spool to the capillary wire holding and bonding tool. In present bonding machines such as the K&S models referred to above, the capillary bonding wire is stored on a spool approximately two inches (5 cm) in diameter and about one inch (2.5 cm) in length. The spool is mounted in a stationary position and is designed to permit the fine wire to be fed off the end in a direction parallel to the axis of the spool. This has proved satisfactory for the slower operation manual bonding machines. For the high speed bonding machines, however, the length of wire stored on the spool is inadequate requiring frequent replacement. The lead wire is normally stored in a single layer to avoid deformation or entanglement of the fine metal wire which may be, for example, a fine gold wire or copper wire 0.001 inches (0.0254 cm) in diameter. For storage of greater length attempts have been made to wind multiple layers of wire on the spool. A disadvantage of this method is that forces from overlying layers tends to deform the underlying layers when wire from the outer layer is drawn from the end of the spool.

Another disadvantage of the conventional method of storing and feeding the fine capillary lead wire is that the wire may twist and turn as a result of torquing forces in the wire itself produced by drawing the wire from the end or top of the stationary spool in the direction parallel to the axis. Thus, for example, it is noted that the lead wire may twist and turn in the capillary wire holding bonding tool and interfere in the bonding operations.

A further disadvantage of the traditional methods of storing and feeding bonding wire in the automatic ball bonders results from the high speed operation. The multiple bonding steps at high speed requires that a reserve of lead wire be maintained and available for feeding directly into the bonding tool in steps of rapid succession to match the high speed of the bonding steps. The conventional ball bonding machines afford no such slack reserve of lead wire sufficient for the high speed automatic operation nor can they assure feeding of lead wire at high speed without becoming tangled, or distorted or deformed.

OBJECTS OF THE INVENTION

It is therefore an object of the present invention to provide a new apparatus for maintaining and feeding bonding lead wire which maintains a slack reserve of lead wire sufficient for high speed fully automatic bonding machines and robots and for high speed multiple bonding operations.

Another object of the invention is to provide apparatus for maintaining in bonding machines and robots of the automatic type a slack reserve of lead wire within a predetermined range of length in untangled condition, for delivery to a capillary bonding tool without distortion or deformation of the fine lead wire.

A further object of the invention is to provide a system for maintaining adequate reserve of lead wire ready for high speed multiple bonding operations in slightly tensioned condition with automatic sensing and control of the rate of delivery, and for controlled feeding of lead wire from a spool without distortion or deformation.

DISCLOSURE OF THE INVENTION

In order to accomplish these results the present invention provides a novel slack chamber arrangement for maintaining a reserve of lead wire in untangled condition. The slack chamber comprises a housing enclosure, an inlet guide on one side for guiding lead wire into the slack chamber from a spool, an outlet guide formed on the opposite side of the housing enclosure for guiding lead wire out of the slack chamber towards the wire bonding tool, and wire sensors operatively positioned for sensing the offset of lead wire passing through the slack chamber from the inlet guide to the outlet guide. A source of pressurized dry air or other gas is provided adjacent the slack chamber at a location between the inlet and outlet guide for directing a gaseous flow into the slack chamber in the direction of the wire sensors. A length of lead wire passing through the slack chamber between the inlet guide and outlet is thereby maintained and suspended in the gaseous flow in a configuration offset from an imaginary line joining the inlet and outlet guides. In this manner a slack reserve of lead wire may be maintained under slight tension for delivery in untangled and undistorted condition to the bonding tool.

According to another aspect of the invention a wire feed control is provided operatively coupled to receive control signals from the wire sensors for controlling the delivery and feeding of lead wire from a spool into the slack chamber in response to the signals. The length of the slack reserve of lead wire under slight tension may therefore be controlled and maintained within a predetermined range. A feature and advantage of the apparatus according to the present invention is that the lead wire is fed from a rotating spool mounted on a spool holder for controlled rotation in response to control signals from the wire sensors. The wire is delivered from the spool without twisting or turning as occurs when the wire is drawn from the end of the spool and distortion and deformation are further eliminated by feeding the wire in a direction generally perpendicular to the axis of the spool and tangent to the cylindrical surface of the spool.

According to a preferred embodiment of the invention, the apparatus includes a spool holder or mounting device, a spool drive motor coupled to the spool mounting device for driving the device and rotating a mounted spool, and control logic operatively coupled to the spool drive motor for turning the motor on and off and thereby advancing lead wire from the spool in predetermined increments. The slack chamber housing includes top and bottom plates spaced apart with side walls and lead wire inlet and outlet guides juxtaposed in opposing side walls.

For the wire sensors the invention contemplates providing a plurality of optical sensors arranged in a row substantially perpendicular to and offset from an imaginary line connecting the inlet and outlet guides of the slack chamber. The optical sensors are operatively coupled to generate control signals for the control logic at the spool drive motor. The row of optical sensors in the preferred embodiment includes an inner limit optical sensor and an outer limit optical sensor arranged to define an inner and outer limit of offset of the lead wire maintained by the flow of gas directed into the slack chamber in the direction along the row of optical sensors. The reserve length of lead wire suspended in untangled condition in the flow of gas is thereby maintained within a desired range.

The inner limit optical sensor defining the inner limit of offset of the lead wire in the slack chamber is operatively coupled to the control logic for turning on the spool drive motor when the lead wire is sensed in the vicinity of the inner limit optical sensor thereby delivering further reserve lead wire to the slack chamber. The outer limit optical sensor is operatively coupled to turn off the spool drive motor when the lead wire is sensed in the vicinity of the outer limit optical sensor so that the length of reserve lead wire is maintained in the slack chamber within the desired range. For the row of optical sensors the invention contemplates a first row of optical sources mounted along one plate of the slack chamber housing enclosure and a corresponding row of optical detectors mounted along the opposite plate of the slack chamber and aligned with the restrictive optical sources.

According to another feature of the invention a plurality of back-up optical sensors are provided along the row for redundancy and safety in controlling delivery of lead wire. For example, a bond machine stop optical sensor is mounted in the row of optical sensors before one or more inner limit optical sensors, and is operatively coupled for turning off the bonding machine if the lead wire offset is reduced to the point where the lead wire is sensed in the vicinity of the bond machine stop optical sensor. A spool drive motor stop optical sensor may also be mounted along the row of optical sensors beyond one or more outer limit optical sensors for shutting off the spool motor if excessive reserve of lead wire occurs in the slack chamber and the lead wire is sensed in the vicinity of the spool motor stop optical sensor. A feature and advantage of using such a row of multiple optical sensors is that the bond machine stop optical sensor serves as a back-up safety for the inner limit optical sensors at the shorter limit of slack reserve maintained in the slack chamber. The spool drive motor stop optical sensor serves as a back-up safety for the outer limit optical sensors in controlling the outer range or longer limit of slack reserve of lead wire maintained in the slack chamber.

According to yet another feature of the invention, automatic arrangements are provided for mounting spools of greater length for accommodating greater storage length of lead wire for use in high speed automatic bonding machines. The spool holder is provided with an optically detectable index or slot. An index or slot detector with associated counter and logic counts the rotations of the spool during unwinding of lead wire for indicating that the spool is empty or in a specified condition of depletion. An axial drive motor is also provided for translating the spool in an axial direction to maintain the angle of entry of lead wire from the spool into the inlet guide of the slack chamber within a desired angular range. The counting logic is operatively coupled to the axial drive motor for actuating the axial drive motor each predetermined number of rotations of the spool to translate the spool along its axis a predetermined distance. The axial drive motor also reverses the direction of axial drive for each predetermined number of turns of the spool corresponding to the end of the spool.

Other objects, features and advantages of the invention are set forth in the following specification and accompanying drawings.

BRIEF FIGURE DESCRIPTION

DESCRIPTION OF PREFERRED EXAMPLE EMBODIMENTS AND BEST MODE OF THE INVENTION

Figure 1:
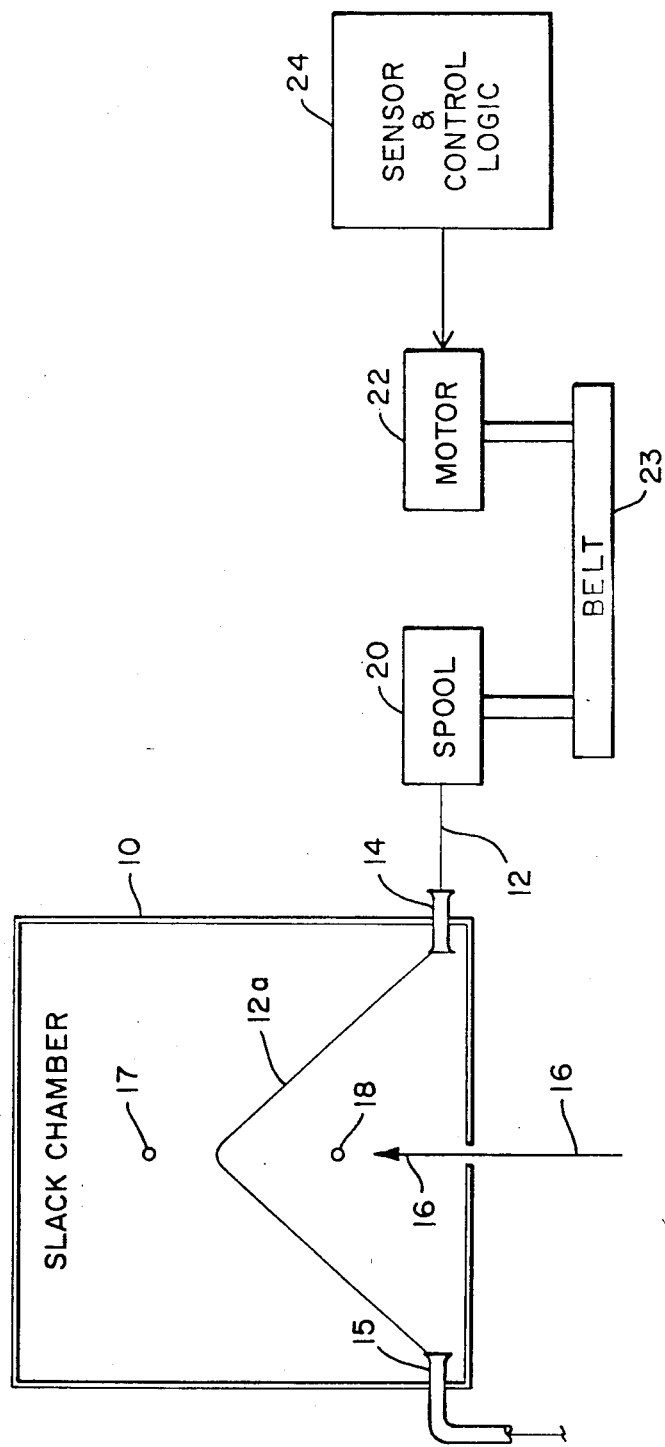
FIG. 1 is a simplified diagrammatic view of an apparatus according to the present invention for maintaining and feeding a slack reserve of lead wire in a bonding machine.

The basic elements of a simplified apparatus for feeding and maintaining a slack reserve of lead wire for a bonding machine are shown in FIG. 1. The heart of the apparatus is a slack chamber 10 in which a length 12a of bonding lead wire 12 passing through the slack chamber from an inlet ferrule 14 to an outlet guide trough 15 is suspended under slight tension in a gaseous flow 16. The gaseous flow is typically dry air or nitrogen directed under pressure through an opening or tube leading into the slack chamber 10. The bonding lead wire 12 is fed into the slack chamber from a spool 20 driven by motor 22 and drive belt 23. The slack reserve length of lead wire 12 is maintained within a predetermined range by the use of wire sensing elements 17 and 18 and the control logic 24 responsive to the wire sensing elements. The sensor and control logic 24 actuates drive motor 22 to initiate or terminate feeding of bonding lead wire 12 into the slack chamber 10 from spool 20 in response to signals received from wire sensing elements 18 and 17. The bonding wire 12 leads through the guide trough 15 at the outlet of slack chamber 10 to the capillary bonding tool, not shown, mounted in the bonding head of the lead wire bonding machine. In the configuration of FIG. 1 the bonding wire 12 is fed or unwound from the side of the spool in a direction substantially perpendicular to the axis of the spool rather than being fed from the end of the spool in a direction parallel to the spool axis as required in conventional bonding machines.

Figure 2:
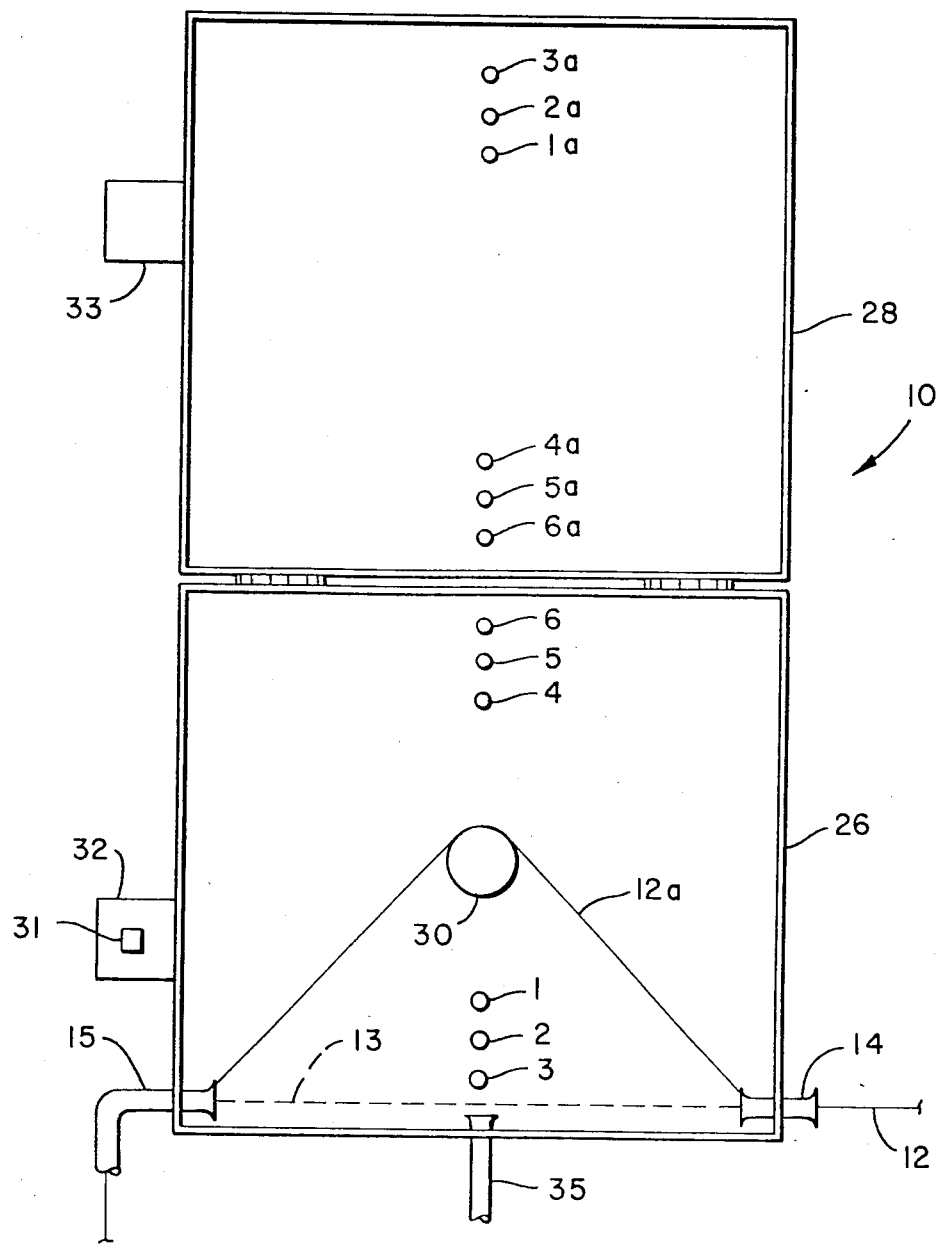
FIG. 2 is a diagrammatic plan view of the slack chamber with the top plate in open position showing the components of the slack chamber with lead wire appropriately threaded through the chamber
Figure 2A:
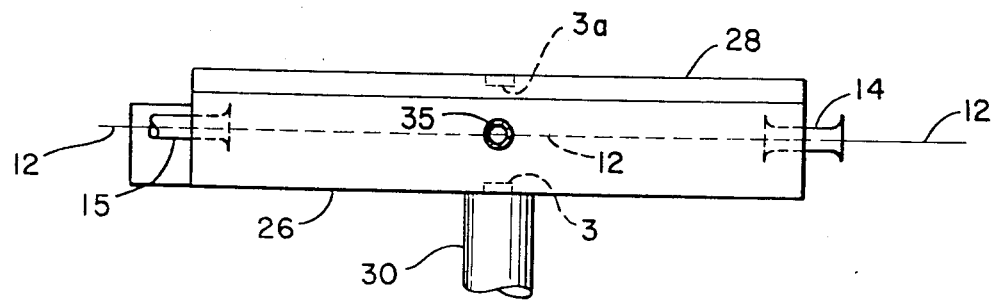
FIG. 2A is a diagrammatic front elevation view of the slack chamber looking in the direction of the row of optical sensors shown in FIG. 2.

Details of the novel wind pressure slack chamber according to the present invention are illustrated in FIGS. 2 and 2A. The slack chamber 10 is comprised of a base 26 and hinge cover 28 shown in open position in FIG. 2. The base 26 of slack chamber 10 includes the inlet ferrule 14 provided with flared ends or tips to minimize physical injury or deformation to lead wire 12. The outlet ferrule or guide trough 15 is similarly seated in the base 26 of the slack chamber.

During threading of lead wire 12 through the slack chamber, the cover 28 is of course in open position. With the cover in open position an extending and retracting threading post or wire holding post 30 extends through a hole in the base 26 into the slack chamber 10. This threading post initially defines the length of slack reserve lead wire 12a along a path offset from an imaginary line 13 drawn between the inlet ferrule 14 and outlet guide trough 15. The extending and retracting threading post 30 thus defines a loop path for the wire as it is threaded by an operator through the chamber 10. When the slack chamber cover 20 is closed, the threading post 30 automatically retracts as shown in FIG. 2A. The extension and retraction of post 30 may be mechanically actuated by opening and closing motion of the cover 28 through appropriate mechanical linkages. Alternatively, the post 30 may be extended and retracted by a solenoid as hereafter described. The solenoid is in turn actuated by, for example, a microswitch 31 mounted on tab 32 extending from the slack chamber base 26. Microswitch 31 is operated by a similar tab 33 mounted on the cover 28.

To provide an indication of the exemplary dimensions of the reserve lead wire slack chamber 10 and the length of reserve lead wire maintained in the slack chamber, FIG. 2 was drawn substantially to the actual scale of an example device. During the initial threading the lead wire 12 is offset in a slack reserve length 12a in a triangular configuration. The slack reserve length is sufficient to provide a reserve for high speed automatic operation of a ball bonding machine. Upon closing the slack chamber cover 28, the source of air or gas under pressure, not shown, is actuated, for example, by microswitch 31 for delivering a stream of dry air or gas. The air stream in blow tube or wind tube 35 is directed through an opening in the slack chamber in a direction across the slack chamber for maintaining the offset configuration of the slack reserve length 12a of lead wire 12 after retraction of the threading post 30.

The slack chamber 10 is provided with two sets of three optical sensors: 1–1a, 2–2a, 3–3a; and 4–4a, 5–5a, 6–6a. The optical sensors are arranged in a row along the axis of the maximum amplitude of offset of the lead wire 12 in the slack chamber. Each optical sensor includes a light source 1 thru 6 such as an LED mounted in the base 26 of the slack chamber and a photo detector such as a photo transistor 1a thru 6a mounted in the cover 28 of the slack chamber in vertical alignment with the respective LED.

As shown in FIG. 2, the first set of optical sensors 1–1a thru 3–3a is mounted in a row along the axis of offset of the lead wire adjacent to the wind tube 35 and the imaginary straight line 13 connecting the inlet ferrule 14 and outlet guide trough 15. As hereafter set forth in further detail, if the slack reserve length of lead wire 12a is depleting and the amplitude of offset decreases to the point where the lead wire crosses the space between the vertically aligned LED light source 1 and photo transistor 1a, the shadow of the lead wire is detected and the sensor and control logic hereafter described actuates the spool drive motor 22 rotating the spool 20 and delivering or incrementing the lead wire in the slack chamber 10. The increasing length of slack reserve wire is suspended, offset and maintained in the air flow and the amplitude of offset increases.

A second row of optical sensors 4–4a through 6–6a is provided along the axis of offset on the far side of the slack chamber away from the wind tube 35. The sensor and control logic continues to actuate spool drive motor 22 rotating spool 20 and feeding lead wire into the slack chamber 10. The slack reserve length of lead wire increases as does the amplitude of offset until the crest of the offset configuration of lead wire crosses the space between LED light source 4 and photo transistor 4a. The optical sensor 4–4a detects the shadow of the lead wire and the sensor and control logic as hereafter described shuts down spool drive motor 22. Spool 20 ceases to feed lead wire into the slack chamber. The slack reserve length 12a of lead wire 12 is therefore maintained within a specified range defined by the optical sensors 1–1a and 4–4a. The optical sensors 1–1a and 4–4a represent respectively the inner and outer or minimum and maximum amplitudes of the offset configuration of lead wire thereby defining or determining the range of length of the slack reserve.

As also hereafter described, back-up, redundancy or safety is built into the apparatus for feeding and maintaining the slack reserve length of lead wire by providing back-up optical sensors. Thus, the first set of optical sensors 1–1a through 3–3a define the minimum length of the range of reserve lead wire and the minimum amplitude of offset. In the event the fine lead wire were to pass through the space of optical sensor 1–1a for some reason without detection, it would be nevertheless detected by optical sensor 2–2a. Similarly, if it were to pass through optical sensor 2–2a undetected or without actuation of the spool drive motor, then optical sensor 3 upon detecting the lead wire wire 12 would shut down the bonding machine itself by actuating the emergency stop of the bonder and also shut down and stop the spool drive motor and any other motor control in the apparatus for feeding and maintaining the reserve slack of lead wire. The second set of optical sensors 4–4a through 6–6a define the outer limit of the range of length of the reserve lead wire and the maximum amplitude of the offset configuration. If the spool and spool drive motor continue to feed increments of lead wire into the slack chamber and the lead wire passes undetected through the space of optical sensor 4–4a, then it will be detected by optical sensor 5–5a which will also shut down the spool drive motor. If the lead wire passes undetected through the space of optical sensors 5–5a, it will finally be detected by optical sensor 6–6a which is also coupled through the sensor and control logic to shut down the spool drive motor upon detecting or sensing the lead wire shadow as hereafter described.

Figure 2B:
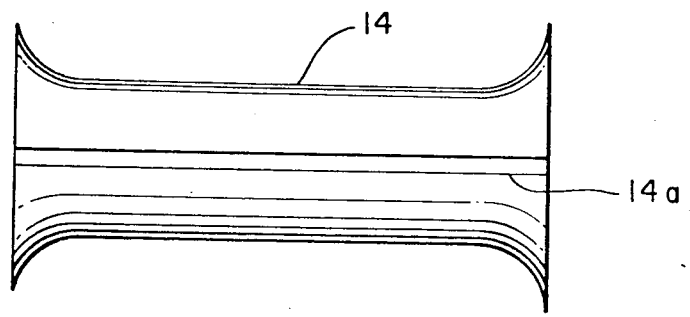
FIG. 2B is a detail of the flared ferrule used for wire guides in the slack chamber.

A detail of the inlet ferrule 14 for the slack chamber is illustrated in FIG. 2B. In FIG. 2 are clearly shown the flared ends of the ferrule which protect the fine capillary lead wire from damage. The lead wire, for example, is typically in the order of one mil in diameter. The ferrule is formed with polished inner surfaces. The ferrule 14 is also provided with a slot 14a for introducing fine lead wire into the ferrule during threading of the lead wire through the slack chamber. The slot 14a is accessible upon opening the cover 28 of slack chamber 10. Similarly, the outlet guide trough 15 is also provided with a threading slot not shown for introducing the lead wire into the outlet guide trough during threading.

Figure 3:
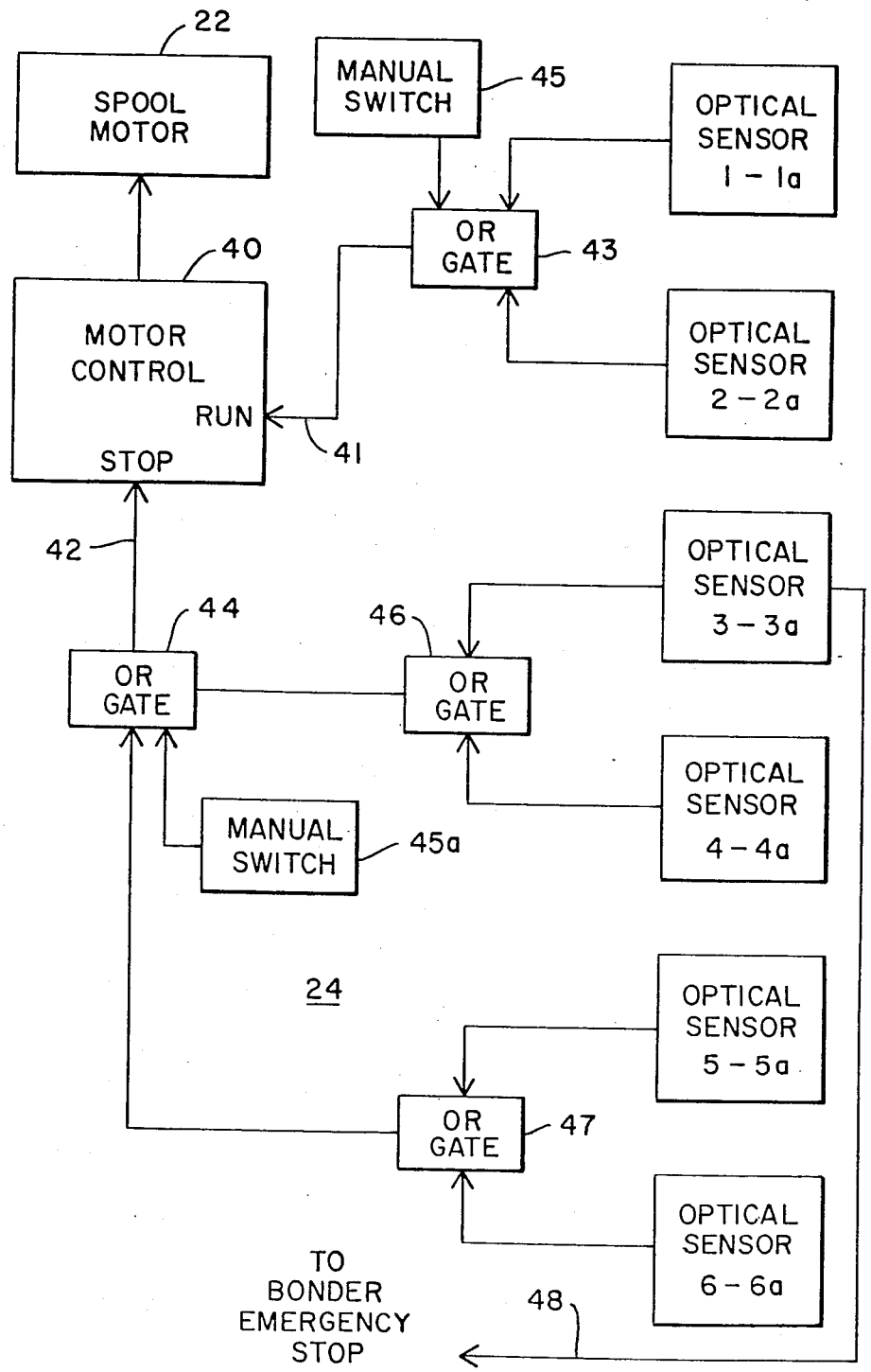
FIG. 3 is a block diagram of the spool rotary drive motor and associated control logic operatively coupled to the row of optical sensors positioned in the slack chamber.

A block diagram showing the electrical coupling of the optical sensors and related apparatus shown in FIGS. 1 and 2 is illustrated in FIG. 3. The spool drive motor 22 is actuated by associated control circuitry and logic 24 including a motor control unit 40 having "run" and "stop" inputs 41 and 42 respectively receiving control signals from OR gates 43 and 44. OR gate 43 passes actuating signals from optical sensors 1–1a and 2–2a for actuating the motor control and turning on the spool drive motor 22. As heretofore described with reference to FIG. 2, optical sensors 1–1a and 2–2a detect the presence of lead wire 12 at the minimum amplitude range for the deflection of the lead wire reserve length 12a and actuate the spool motor to feed lead wire into the reserve chamber increasing the deflection and amplitude of the offset configuration. Detection of the presence of the reserve lead wire length 12a by either optical sensor 1–1a or 2–2a actuates the "run" input to the motor control through the alternative OR gate 43. The manual control 45 allows an operator to increase the slack reserve length of lead wire during threading through the slack chamber when cover 28 is open. Manual control 45a turns off the spool drive motor.

OR gate 46 transmits shut down signals received from optical sensors 3–3a and 4–4a through OR gate 44 to the stop input 42 of the motor control unit for deactuating and turning off the spool drive motor 22. Similarly, OR gate 47 transmits shut down signals received from optical sensors 5–5a and 6–6a through OR gate 44 to the "stop" input 42 of the motor control unit 40. Signals from optical sensors 5–5a and 6–6a will therefore also shut down the spool drive motor and stop the feed of lead wire into the slack chamber. A signal from optical sensor 3–3a not only turns off the spool drive motor 23 but also shuts down the bonding machine itself through lead 48 which is connected to the emergency stop input of the bonder or bonding machine. Optical sensor 3–3a is located at the inner limit of range of the slack reserve length as the deflection of the reserve length 12a approaches the imaginary straight line 13 between the lead wire inlet and outlet guides 14 and 15 of the slack chamber 10. If for some reason the lead wire is not detected in the vicinity of optical sensors 1–1a and 2–2a as the lead wire slack reserve length is depleted, the optical sensor 3–3a will shut down the bonding machine to prevent breaking or severing of the lead wire until an operator opens the slack chamber, actuates the spool drive motor and resets the offset deflection of lead wire around the extending and retracting post 30.

Optical sensors 4–4a, 5–5a and 6–6a respectively issue shut down signals for turning off the spool drive motor as the slack reserve length of lead wire and amplitude of deflection increase to the maximum limit of the permitted range. If for some reason optical sensors 4–4a and 5–5a fail to sense or detect the lead wire as the deflection amplitude increases during feeding of lead wire into the slack chamber, then optical sensor 6–6a provides a final back-up and safety for turning off the spool drive motor. Thus, the sensor and control logic of FIG. 3 affords calculated redundancy in the form of successive back-up safety controls for maintaining the slack of reserve wire within the minimum and maximum limits of the desired range of length.

Figure 4:
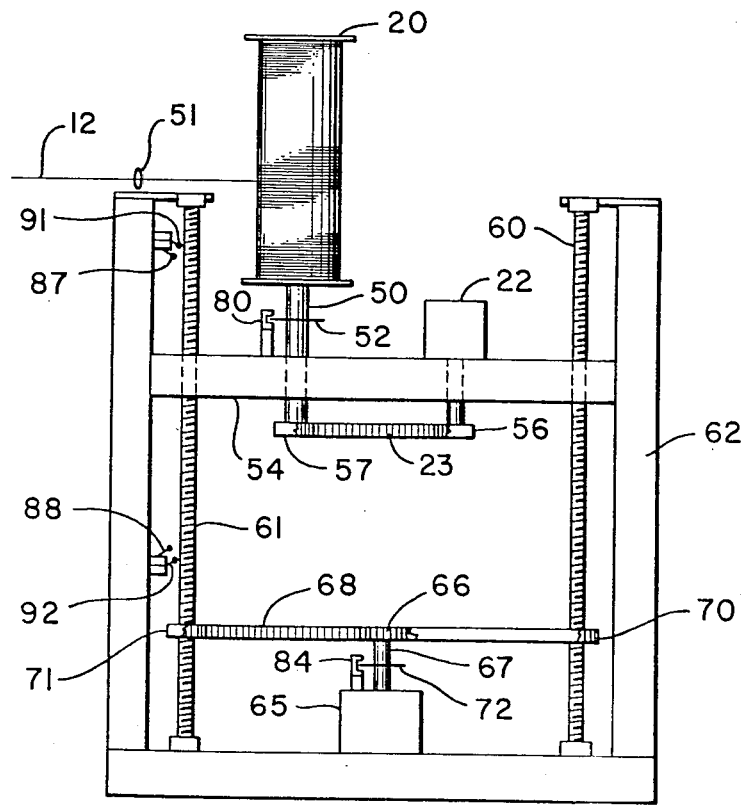
FIG. 4 is a mechanical diagrammatic view of the rotary drive motor and axial drive motor couplings relative to the spool mounting device or holder with the drive belts partially cut away.
Figure 4A:
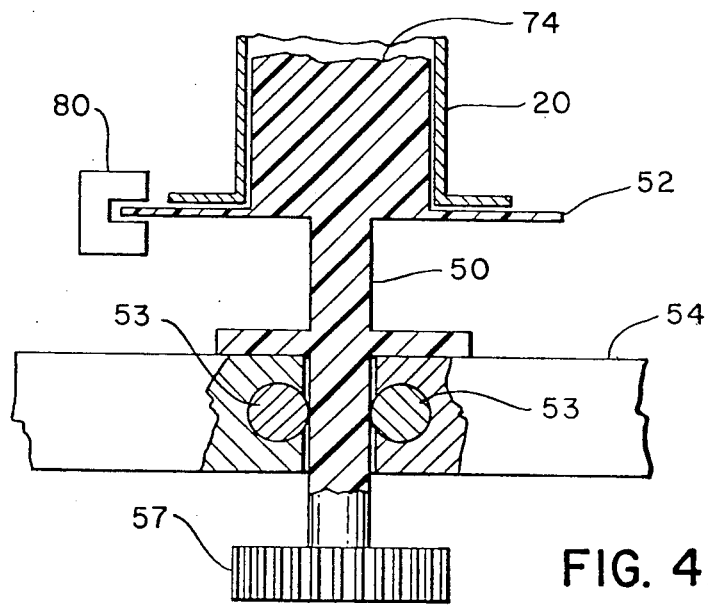
FIG. 4A is a detailed fragmentary side cross section of an alternate spool mounting device or holder.

Details of a mechanical arrangement for mounting a spool of lead wire and for controlled feeding of the lead wire into the slack chamber is shown in FIGS. 4 and 4A. The spool 20 is mounted for rotation about the spool axis on a drive shaft 50 including a slotted disk 52 which rotates with shaft 50 and spool 20. The shaft is mounted for rotation on bearings 53 on a carriage mounting plate 54. The spool drive motor 22 is similarly mounted on the carriage plate 54 and rotates the shaft 50, slotted disk 52, and spool 20 by means of the timing belt, notched belt or chain 23 mounted respectively on the belt wheels 56 and 57 of the drive shaft of motor 22 and rotating shaft 50. The use of a notched belt or timing belt maintains registration between the turning of the spool drive motor 22 and the turning of the slotted disk 52.

The carriage plate 54 is in turn supported, mounted and journaled for translation on the threaded rods 60 and 61 which rotate within frame pieces of the stationary base or frame 62. Threaded rods 60 and 61 are driven in rotation by axial drive motor 65 mounted on the stationary base 62 and provided with a belt wheel 66 at the end of its drive shaft 67. Axial drive motor 65 turns the journaled shafts 60 and 61 by means of the drive belt 68 which engages belt wheels 70 and 71 fixed respectively to the journaled shafts 60 and 61. A slotted disk 72 is also provided on the drive shaft 67 of the axial drive motor 65. Drive belt 68 is also a notched belt, timing belt or chain to maintain registration between the turning of slotted disk 72 and the turning of threaded rods 60 and 61.

By this apparatus arrangement, the objective of the present invention is achieved of feeding the lead wire 12 from spool 20 at all times tangent to the cylinder of the spool and perpendicular to the spool axis represented by shaft 50. As shown in more detail in FIG. 4A, the shaft 50 terminates in a spindle 74 on which the spool is mounted by frictional fitting so that spool rotates with the shaft. While spool drive motor 22 rotates the spool 20, feeding the fine bonding lead 12 into the slack chamber 10, axial drive motor 65 is coordinated through the logic circuitry of FIG. 5 hereafter described to translate the carriage 54 and maintain the lead wire 12 feeding from the spool substantially at right angles to the spool axis and tangent to the spool cylinder. A feature and advantage of this mechanical and control circuitry arrangement is that the very fine lead wire exiting the spool is not drawn over underlying layers thereby eliminating damage to or deformation of the lead wire. According to conventional procedures for feeding lead wire from the end of the spool in the direction of the spool axis, a gold lead wire spool is limited to a single layer because of the deformation which would otherwise occur to the underlying layer. According to the method of the present invention, multilayered spools may be used storing greater lengths of wire and requiring less frequent change of spools. Furthermore, by use of the translating carriage 54 a spool 20 of greater length may be used while still maintaining aligned feed of the lead wire from the spool in a direction tangent to the spool cylinder and perpendicular to the spool axis. To isolate the bonding wire and spool electrically from ground for certain applications, the spool mounting assembly or holder is composed of or in turn mounted on insulating material using a rubber drive belt between the spool and drive motor.

Figure 5:
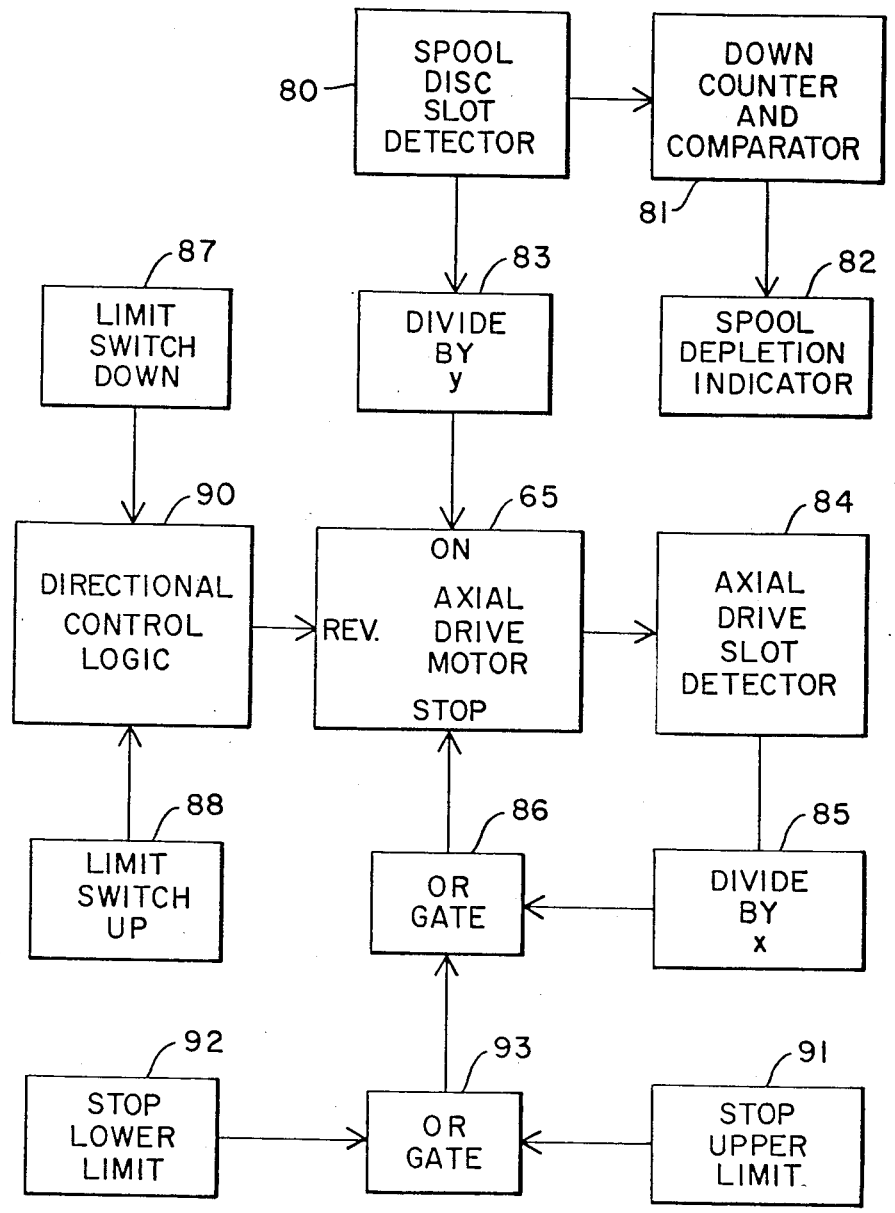
FIG. 5 is a block diagram of the spool axial drive servomotor and associated counter and control logic.

Referring both to FIGS. 4 and 5, the spool disk 52 mounted on shaft 50 rotates with spool 20 and is formed with a slot which is detected by slot detector 80. The slot detector 80 provides a signal each time the slot and spool rotate 360° for counting the turns of wire fed from the spool by a downcounter and comparator 81. The downcounter 81 is preset for indicating depletion of the spool by indicator 82 after a preset number of turns have been counted. At the same time the signals from the slot detector 80 are also input to a divide by "Y" circuit 83 for actuating the axial drive motor 65 each "Y" number of turns to maintain an axial translation of the spool 20 commensurate with the lateral depletion of turns of wire.

Coordination between the spool drive motor 22 and axial drive motor 65 is achieved by the coordinated use of the second axial drive slot detector 84 which detects the slot in axial drive motor disk 72 for each 360° rotation of the disk 72. The signal from axial drive slot detector 84 is fed to a divide by "X" circuit 85 which provides a signal each "X" number of rotations of the disk 72 through OR gate 86 to stop the axial drive motor 65. In this example embodiment of the present invention, "Y" equals the number of turns of wire on spool 20 per unit length, while "X" equals the number of turns of the thread of threaded rods 60 and 61 per unit length. The control circuitry of FIG. 5 therefore equalizes the translation of carriage 54 in the axial direction of spool 20 with the depletion of turns of lead wire in the axial direction of the spool. Typically, the number of turns of wire "Y" per unit length is considerably greater than the number of threads "X" per unit length of rods 60 and 61 so that a few turns of rods 60 and 61 by axial drive motor 65 provides the same axial distance as many turns of spool 20 driven by spool drive motor 22. The selection of the numbers "X" and "Y" for a particular application may be input to the respective divide circuits 85 and 83 by thumb wheel switches.

Control of the direction of rotation of axial drive motor 65 and therefore the direction of translation of carriage 54 is achieved by limit switches 87 and 88. Contact of carriage 54 with limit switch 87 initiates a signal through directional control logic 90 to reverse direction of axial drive motor 65 and commence movement of the carriage in the down direction. Contact of carriage 54 with microswitch 88 initiates a signal through directional control logic 90 to reverse the axial drive motor 65 and commence motion of carriage 54 in the upward direction. Upper limit microswitch 91 provides an emergency stop should the carriage for some reason proceed beyond microswitch 87. Lower limit microswitch 92 provides a lower limit emergency stop signal should carriage 54 for some reason proceed beyond microswitch 88. The emergency stop signals from outer limit switches 91 and 92 pass through OR gate 93 and OR gate 86 to the axial drive motor 65.

Figure 6:
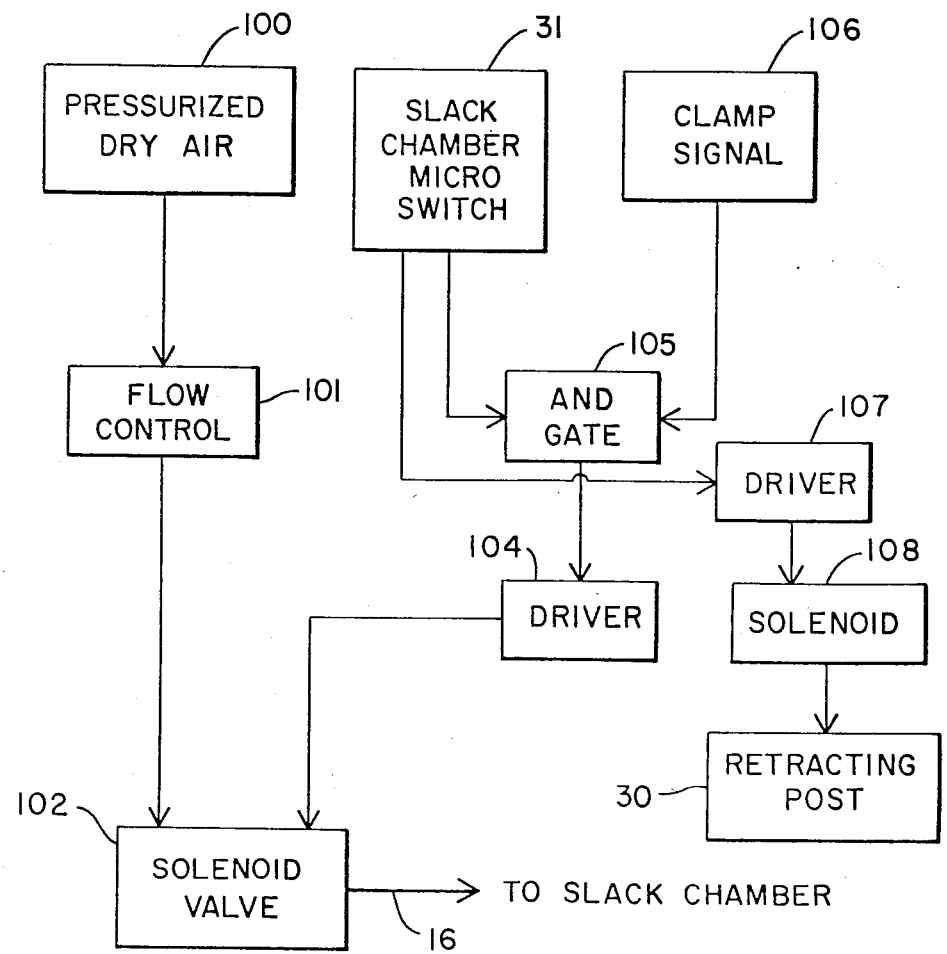
FIG. 6 is a block diagram of the slack chamber air flow control.

The airflow system and airflow control for maintaining the slack reserve of lead wire in offset configuration under slight tension is shown in FIG. 6. Pressurized dry air or nitrogen from a source 100 is regulated by flow control 101 and admitted into the wind tube 35 of the slack chamber 10 by means of a solenoid valve 102. Solenoid valve 102 may be, for example, an electrically actuated solenoid valve or a pneumatically or air actuated solenoid valve which admits air into the wind tube or blow tube 35 leading into the slack chamber and shuts off the air flow when the valve is closed. The pressurized air or nitrogen from source 100 is appropriately processed and dried to prevent corrosion or deterioration of the fine metal wire suspended in the slack chamber air flow. The dry air or nitrogen in fact serves to clean the lead wire.

The solenoid valve 102 is opened by driver 104 when a signal is received from AND gate 105. A signal appears at the output of AND gate 105 when signals coincide at the AND gate inputs from the microswitch 31 in the slack chamber and clamp signal 106 originating in the ball bonding machine. Clamp signal 106 indicates that the lead wire is being held by clamps in the bonding head so it will not pull out when the air stream is initially applied in slack chamber 10. Microswitch 31 provides a signal upon closing of the cover or lid 28 over the base 26 of slack chamber 10. The microswitch signal generated by closing the slack chamber, coinciding with clamp signal 106 at AND gate 105 may also be used to actuate a separate solenoid 108 through driver 107 for retracting the extending and retracting post 30. Alternatively, the retracting post may be actuated by the mechanical motion of the slack chamber cover lid 28.

The air flow through wind tube or blow tube 35 directing a wind or stream of air into the slack chamber along the row of two sets of optical sensors should be sufficient to suspend and maintain the slack reserve length of lead wire under slight tension in untangled condition. However, the force on the wire due to the velocity and volume of air flow should be less than the holding or clamping forces on the lead wire in the vicinity of the bonding head afforded by the particular bonding machine. More generally, the force on the slack reserve length of lead wire due to wind pressure should be kept down to a level that does not interfere with the bonding and welding operations of the particular machine. Specifically, the force on the wire due to wind pressure must be small enough not to interfere in bonding operations during so-called "looping" from the ball bond to the weld or wedge bond and must be less than the holding, clamping or drag forces on the wire provided by the bonding machine in the vicinity of the bonding head.

The fine bonding lead wire is typically 1 to 1.15 mil wire. For this fine wire a blow tube or wind tube 35 of, for example, ⅛ inch (0.3 cm) outer diameter (o.d.) has been found sufficient with pressure for the dried air or nitrogen in the order of, for example, 10 to 50 psi. The volume of air flow is therefore so small that the air flow or wind may be left on at all times, for example, overnight and on weekends or between operating shifts of the bonding machine. For example, 12 standard cubic feet per hour (scfh) of dry nitrogen at 30 psi through ⅛ inch (0.3 cm) o.d. tubing is sufficient. In this manner, the slack reserve length of lead wire may be maintained at all times under slight tension and in untangled condition. The air flow may therefore remain on at all times until a particular spool is depleted.

The usual wire length in conventional spools, for example, of fine gold bonding lead wire is 330 feet (100 m) and the spool requires frequent replacement. According to the apparatus and method of the present invention, an elongate spool may be used with greater capacity and several layers of wire for a total length of, for example, 1,000 (300 m) to 1,500 feet (457 m). According to the present invention spool replacement is therefore less frequent and the air flow simply remains on maintaining the slack reserve of lead wire under slight tension and in untangled condition until the spool of greater capacity is depleted. As an additional feature a separate emergency power supply such as a back-up battery may be provided for the air supply system to maintain the air flow in the event of loss of power. Similarly, the back-up power supply may be available on standby for the entire bonding lead wire feed and reserve maintenance equipment to preserve, for example, the counting memory of the sensor and logic control circuitry to keep track of the state of depletion of the spool in the event of loss of power.

Figure 7:
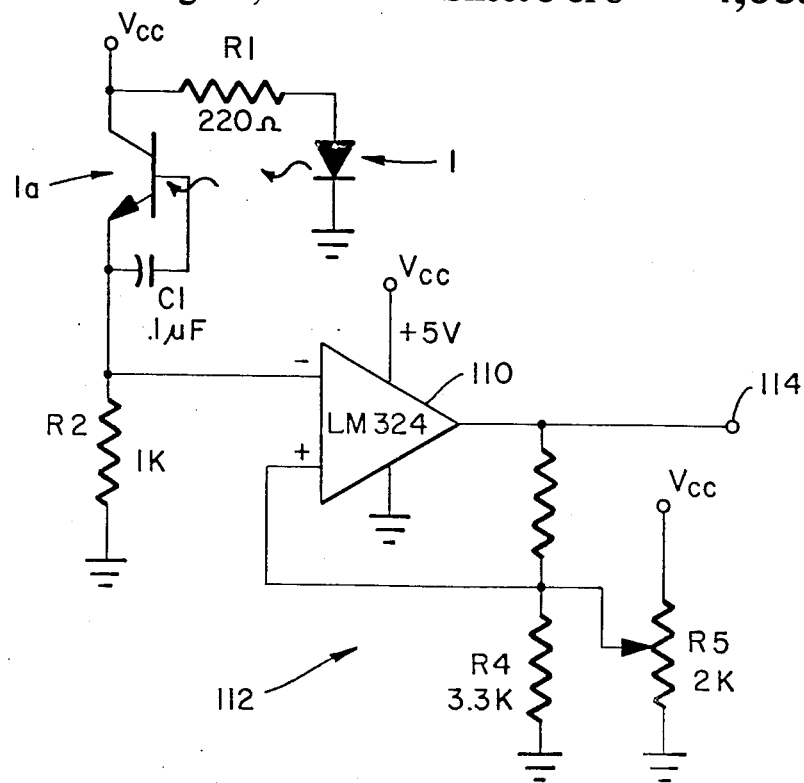
FIG. 7 is a schematic diagram of a typical optical sensor and detector circuit for use in the present invention.

In the slack chamber cavity construction, black anodized aluminum, for example, may be used on the inside bottom of the chamber. The LED light sources 1 thru 6 are positioned in the base 26 looking up from the bottom and are typically infrared light sources. The infrared sensitive photo transistors 1a thru 6a are positioned on top respectively aligned with the LED light sources 1 thru 6. The typical circuit for each optical sensor or optical detector 1-1a thru 6-6a is illustrated in FIG. 7. The LED infrared emitter 1 appropriately juxtaposed relative to infrared detector photo transistor 1a are coupled in a detector circuit with operational amplifier 110 which may be, for example, an LM 324 op amp. The op amp 110 compares the voltage across the voltage divider network 112 including the variable potentiometer $R_5$, to the voltage drop across $R_2$. The voltage drop across $R_2$ changes with the presence of lead wire between infrared emitter 1 and infrared detector 1a. The potentiometer $R_5$ sets the threshold at which the output 114 switches from normally low state to high state when the infrared beam is interrupted by the lead wire. The optical sensor output at terminal 114 therefore switches from the normally low voltage state to high when the infrared beam is interrupted.

Figure 8:
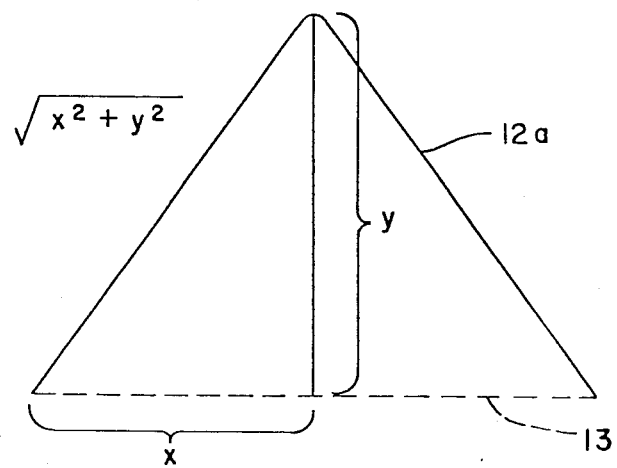
FIG. 8 is a diagrammatic view of the lead wire configuration in the slack chamber of FIG. 2.

During high speed ball bonding and wedge bonding operation, it is important to maintain a sufficient reserve length of lead wire in untangled condition to meet successive bonding operations. This may be accomplished with a slack chamber having dimensions, for example, of 10 cm square. With a slack chamber of these dimensions and in the configuration of FIG. 2, Table I summarizes in Column F the slack reserve length 12a of lead wire available for each of the different angles $\theta$ of offset from the imaginary line 13. The lead wire configuration in the chamber is shown diagrammatically in FIG. 8. In Table I Column A lists the successively greater amplitudes in centimeters corresponding to the successively greater angles $\theta$ of offset. Amplitude is the distance between the peak or crest of the triangular offset configuration and imaginary line 13. The distance X represents half the width of the slack chamber or 5 cm with $x^2=25$ cm. The hypotenuse of the right triangle formed by the reserve length of lead wire in each half of the slack cavity is shown in Column D for each different angle of offset $\theta$ as calculated from Columns B and C. The actual slack reserve length of lead wire in each half of the slack chamber, that is the left half and right half is indicated in Column E with Column F showing the full slack reserve length from the two right triangles in each half of the slack chamber. Thus, if the initial angle of offset of the lead wire 12 entering the slack chamber is 61° and the angle of offset is reduced to 58° as a result of bonding operations, the length of lead wire depleted is 10.6 cm minus 8.8 cm or approximately 1.8 cm. If the angle of offset is reduced from 61° to 55° by reason of depletion of the lead wire through bonding operations, the length of lead wire withdrawn is approximately 3.4 cm. This corresponds to a 2 cm reduction in the amplitude of offset of the peak of the offset configuration. In this manner, the offset can initially be adjusted to afford the slack reserve length of lead wire necessary to accommodate the speed of operation of the particular ball bonding machine. It is found that an optimum angle of entry for the slack reserve length 12a is between 50° and 60°. A transparent cover 28 may be provided over the wind chamber cavity or slack chamber 10 for a visual check of the status of the slack reserve length of lead wire.

While the invention has been described with reference to particular example embodiments, it is intended to cover all variations and equivalents within the scope of the following claims.

TABLE I

| y | $y^2$ | $x^2 + y^2$ | $\sqrt{x^2 + y^2}$ | $\sqrt{x^2+y^2} - x$ | SLACK RESERVE LENGTH | $\theta$ $\tan^{-1} y/x$ |
|---|---|---|---|---|---|---|
| 1 | 1 | 26 | 5.1 | 0.1 | .2 | 11° |
| 2 | 4 | 29 | 5.38 | 0.38 | 0.76 | 22° |
| 3 | 9 | 34 | 5.83 | 0.83 | 1.66 | 31° |
| 4 | 16 | 41 | 6.40 | 1.40 | 2.80 | 39° |
| 5 | 25 | 50 | 7.07 | 2.07 | 4.14 | 45° |
| 6 | 36 | 61 | 7.81 | 2.81 | 5.62 | 50° |
| 7 | 49 | 74 | 8.60 | 3.60 | 7.20 | 55° |
| 8 | 64 | 89 | 9.43 | 4.43 | 8.86 | 58° |
| 9 | 81 | 106 | 10.3 | 5.3 | 10.6 | 61° |
| 10 | 100 | 125 | 11.2 | 6.2 | 12.4 | 64° |

We claim:

1. An apparatus for feeding bonding lead wire from an elongate spool to the capillary wire holding tool of a lead wire bonding machine comprising:

spool mounting means constructed and arranged for mounting the spool for rotation around the spool axis;

spool motor means coupled to the spool mounting means for rotating a spool about the spool axis;

control means operatively coupled to the spool motor means for actuating said spool motor means and advancing lead wire from the spool in predetermined increments;

axial drive motor means operatively coupled to the spool mounting means for translating said spool in an axial direction to maintain the angle of feeding of lead wire from the spool within a desired angular range;

said spool mounting means comprising a rim having index means formed thereon, spool rotation sensor means operatively mounted and coupled to the spool mounting means for detecting the index means upon rotation of the spool and for generating corresponding signals, counting logic means operatively coupling said spool rotation sensor signals and the axial drive motor means for actuating said axial drive motor means each predetermined number of rotations for maintaining the wire feeding from the spool substantially at right angles to the axis of the spool.

2. The apparatus of claim 1 wherein said spool mounting means comprises a rim which rotates with a spool mounted on the spool mounting means, said rim formed with optically detectable index means, said spool rotation sensor means comprising rim optical sensor means operatively mounted in stationary position for sensing the index means upon each rotation of the spool and for generating corresponding signals, said counting logic means being operatively coupled for counting said corresponding signals and hence the number of rotations during unwinding of a spool mounted on the spool mounting means, and indicator means operatively coupled to said counting logic means for indicating that the spool is empty or in a specified condition of depletion based upon the counted number of rotations.

3. The apparatus of claim 1 further comprising directional control means operatively coupled for reversing the direction of axial translation of a spool mounted on the spool mounting means by the axial drive motor means.

4. The apparatus of claim 1 further comprising first timing belt means operatively registering the turning of the spool motor means and spool mounting means and second timing belt means operatively registering translation by the axial drive motor means.

* * * * *